United States Patent
Turudic

[19]

[11] Patent Number: 6,078,505
[45] Date of Patent: Jun. 20, 2000

[54] CIRCUIT BOARD ASSEMBLY METHOD

[75] Inventor: Andy Turudic, Hillsboro, Oreg.

[73] Assignee: TriQuint Semiconductor, Inc., Hillsboro, Oreg.

[21] Appl. No.: 09/312,155

[22] Filed: May 14, 1999

[51] Int. Cl.⁷ ...................................... H05K 1/18
[52] U.S. Cl. .......................... 361/760; 361/803; 361/767; 361/765; 257/773; 257/690; 257/737; 257/738; 174/255; 174/260; 174/52.1; 228/180.21; 228/180.22; 439/68
[58] Field of Search ..................................... 361/760, 803, 361/707, 764, 765; 257/782, 773, 690, 737, 723, 734, 738; 174/255, 260, 262, 52.1; 228/180.21, 180.22; 439/68, 74

[56] References Cited

U.S. PATENT DOCUMENTS

| | | | |
|---|---|---|---|
| 5,471,090 | 11/1995 | Deutsch et al. | 257/734 |
| 5,663,594 | 9/1997 | Kimura | 257/666 |
| 5,859,474 | 1/1999 | Dordi | 257/737 |
| 5,895,554 | 4/1999 | Gordon | 156/556 |
| 5,917,149 | 6/1999 | Barcley et al. | 174/35 C |
| 5,951,304 | 9/1999 | Wildes et al. | 439/67 |

*Primary Examiner*—Leo P. Picard
*Assistant Examiner*—David Foster
*Attorney, Agent, or Firm*—Skjerven, Morrill, MacPherson, Franklin & Friel LLP

[57] ABSTRACT

A method is disclosed for attaching a device package to a circuit board with a chip mount area that has a set of elongated pads located near the perimeter of a chip mount area. In accordance with this method, a mask is formed on the circuit board. A plurality of openings are formed in the mask, including a plurality of openings over at least one of the pads. A plurality of adhesive masses area attached to a surface of the device package, each adhesive mass being aligned with an electrical contact area on the surface of the device package. The device package is positioned over the circuit board to align the adhesive masses with the openings in the mask, and the device package is attached to the circuit board. In one embodiment, the mask openings are formed in a staggered formation. An advantage of this method is that a less expensive chip of the ball grid array type may be used on a circuit board design for gull-wing-leaded chip packages without a substantial redesign of the circuit board. The invention also allows ball grid array-type packages and gull-wing leaded chip packages to be used interchangeably for the same circuit board design with only a modification of the mask used in the circuit board fabrication process.

10 Claims, 3 Drawing Sheets

CIRCUIT BOARD ASSEMBLY METHOD

TECHNICAL FIELD OF THE INVENTION

The present invention relates to circuit boards, and in particular to a circuit board assembly method.

BACKGROUND OF THE INVENTION

Two of the most common, conventional types of integrated circuit packages are gull-wing leaded packages and ball grid array or "flip chip" packages. Each type of package has a corresponding configuration of pads on a circuit board designed to accommodate the package and to provide reliable electrical contact and physical adhesion of the package to the circuit board.

Generally, a gull-wing leaded package, and in particular a ceramic package, is more costly to assemble than a ball grid array package because each lead must be individually brazed onto the package. Substitution of ceramic gull-wing leaded packages with ball grid array packages is therefore generally more economical. However, when a circuit board is already in production, substitution of ceramic gull-wing leaded packages with ball grid array packages may not be cost effective, because a substantial redesign of the circuit board would be necessary to accommodate a conventional ball grid array package.

SUMMARY OF THE INVENTION

Therefore, a need has arisen for a ball grid array type device package that addresses the disadvantages and deficiencies of the prior art. In particular, a need has arisen for a method for attaching a ball grid array-type device package to a circuit board designed to mount a gull-wing-leaded package.

Accordingly, a method is disclosed for attaching a device package to a circuit board with a chip mount area that has a set of elongated pads located near the perimeter of a chip mount area. In accordance with this method, a mask is formed on the circuit board. A plurality of openings are formed in the mask, including a plurality of openings over at least one of the pads. A plurality of adhesive masses are attached to a surface of the device package, each adhesive mass being aligned with an electrical contact area on the surface of the device package. The device package is positioned over the circuit board to align the adhesive masses with the openings in the mask, and the device package is attached to the circuit board. In one embodiment of the present invention, the mask openings are formed in a staggered formation.

In accordance with another embodiment of the present invention, a circuit board is disclosed in which a chip mount area has a plurality of elongated pads designed for contact with device package leads. The circuit board includes a device package with a plurality of electrical access areas formed on one surface. Adhesive joints such as solder joints provide a connection between the electrical access areas of the device package and the pads of the chip mount area.

An advantage of the present invention is that a less expensive chip may be used on a circuit board designed for gull-wing-leaded chip packages without a substantial redesign of the circuit board. Another advantage of the present invention is that a device packages constructed in accordance with the present invention and gull-wing leaded chip packages may be used interchangeably for the same circuit board design with only a modification of the mask used in the circuit board fabrication process.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 4 of the drawings. Like numerals are used for like and corresponding parts of the various drawings.

Figure 1:
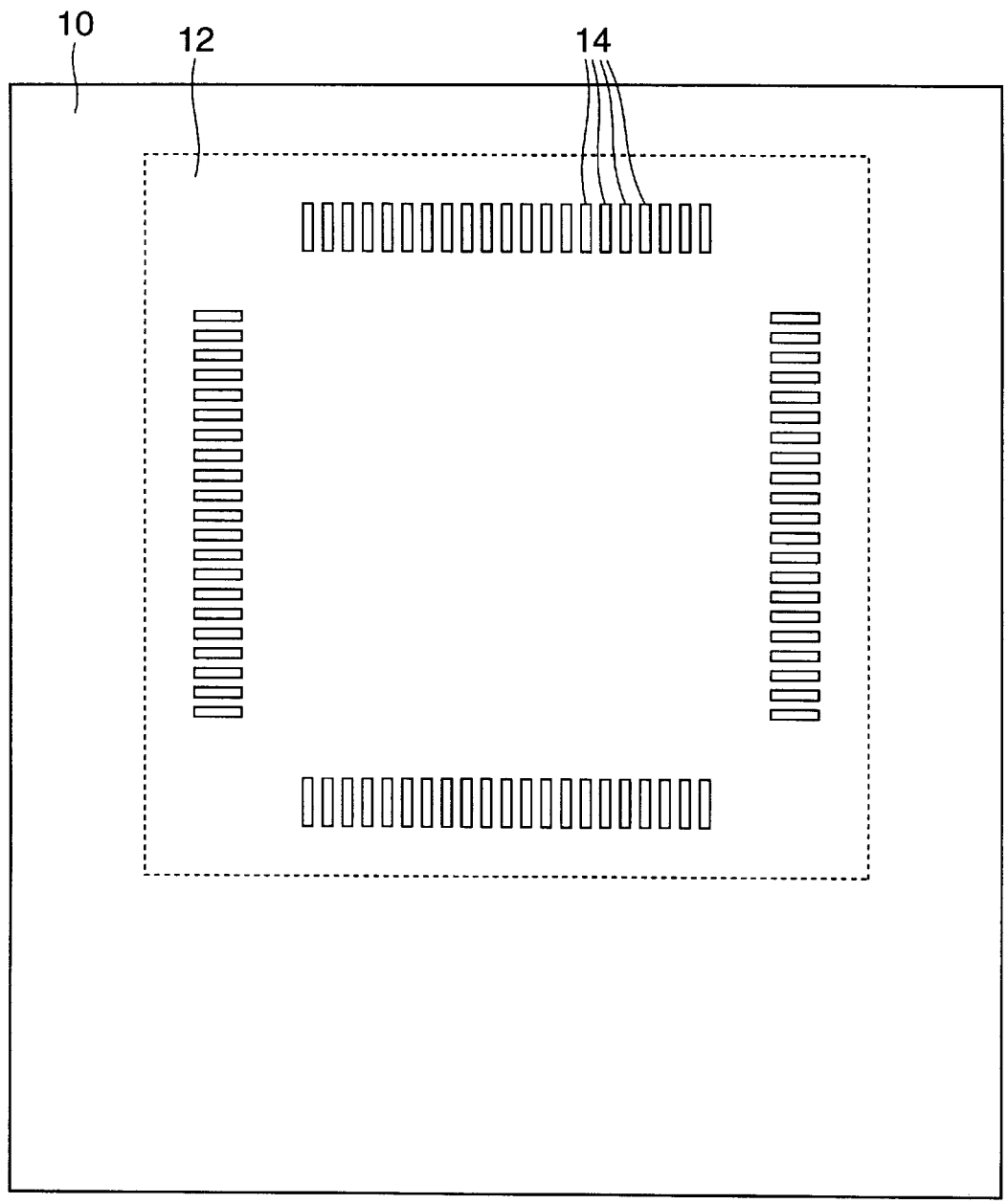
FIG. 1 is a top view of a circuit board constructed in accordance with the present invention.

Referring to FIG. 1, a circuit board 10 is shown. Circuit board 10 has a chip mount area 12 designed for a gull-wing-leaded chip to be mounted thereon. Circuit board 10 may be configured to accept several such chips, and may provide signal routing and power supply to such chips. Circuit board 10 may be, for example, a circuit board for which an assembly process involving the attached of gull-wing-leaded chips has already been devised and implemented.

Chip mount area 12 includes a set of rectangular pads 14 arranged in four rows around the perimeter of chip mount area. Each pad 14 is made from a conductive material such as copper and is designed to establish electrical contact with a corresponding gull-wing lead on a device package.

In accordance with the present invention, a method is disclosed herein for mounting a ball grid array-type device package, such as a ball grid array integrated circuit package, on chip mount area 12. This allows a less expensive chip or two types of packages to be used with circuit board 10 without a substantial redesign of circuit board 10.

Figure 2:
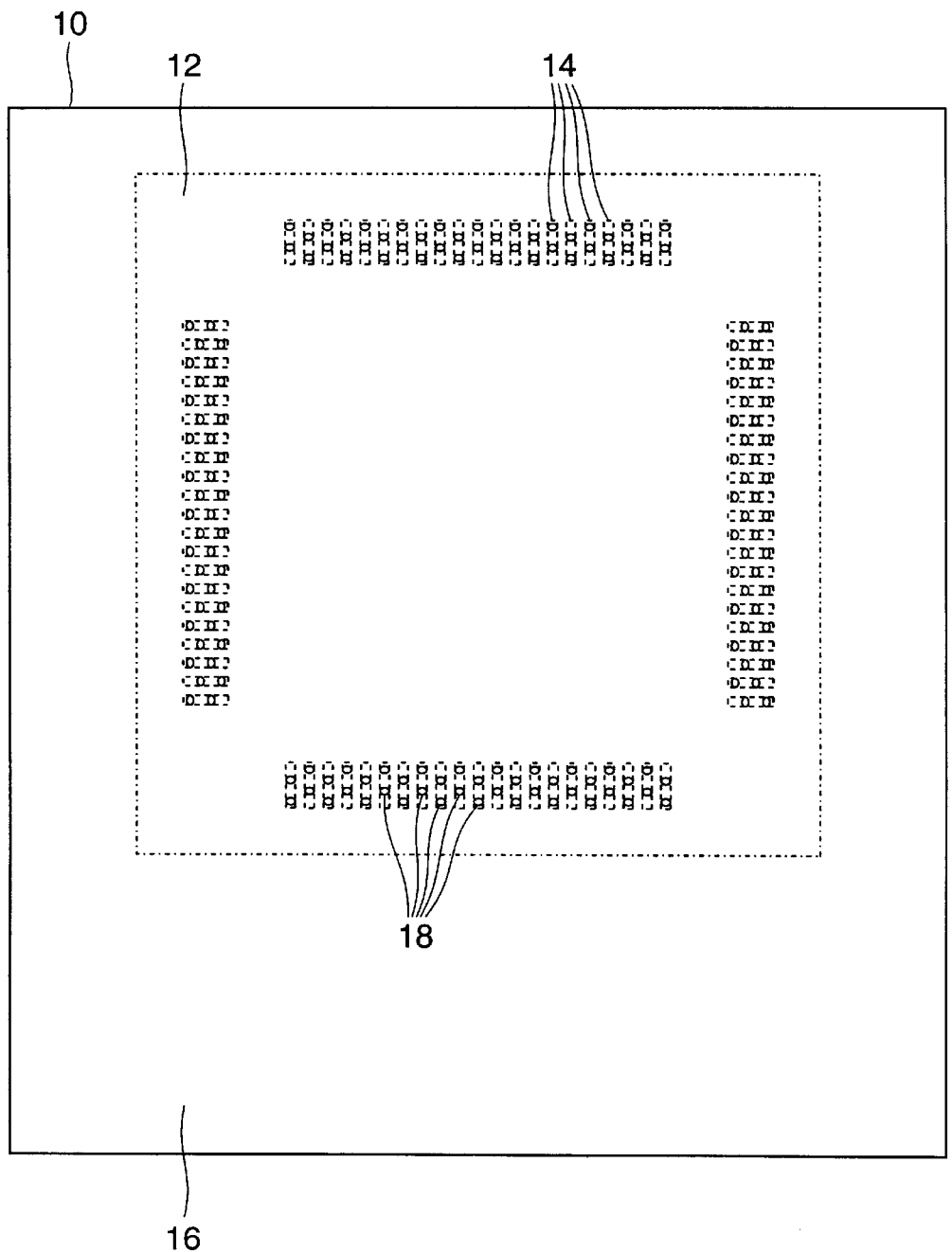
FIG. 2 is a top view of the circuit board at a later stage in the construction process.
Figure 3:
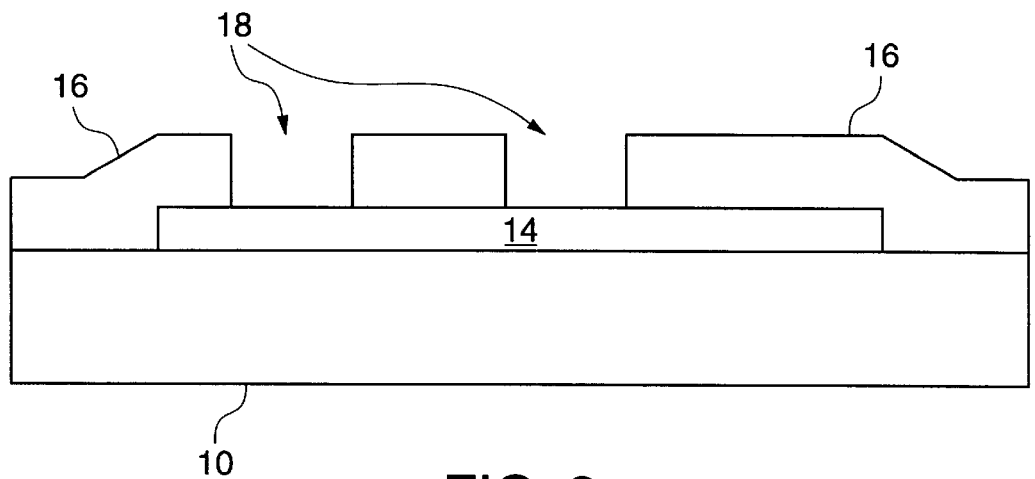
FIGS. 3 and 4 are cross sections of the circuit board at different stages of assembly.

This method is illustrated in FIGS. 2 and 3, where a top view and cross section, respectively, of circuit board 10 are shown. A solder mask 16 is formed over circuit board 10, and in particular over chip mount area 12. Solder mask 16 may be, for example, an adhesive polymer film such as those commonly used in ball grid array circuit board assembly. Alternatively, solder mask 16 may be deposited as a liquid polymer using a silk-screen process. The polymer is then cured to form solder mask 16.

Solder mask 16 has a set of contact holes 18 formed therein that expose selected areas of pads 14. In the case of an adhesive polymer film, contact holes 18 may be formed by a photolithographic etching process. If solder mask 16 is deposited as a liquid polymer by a silk-screen process, contact holes 18 may be formed during the silk-screen deposition process.

In the example shown in FIGS. 2 and 3, two circular contact holes 18 are formed over each pad 14. Contact holes 18 are formed in a staggered arrangement so that, within each row of pads 14, contact holes 18 form a "checkerboard" pattern in which contact holes 18 over adjacent pads 14 are not aligned in a linear fashion. The reason for this novel arrangement of contact holes 18 will be explained below.

Figure 4:
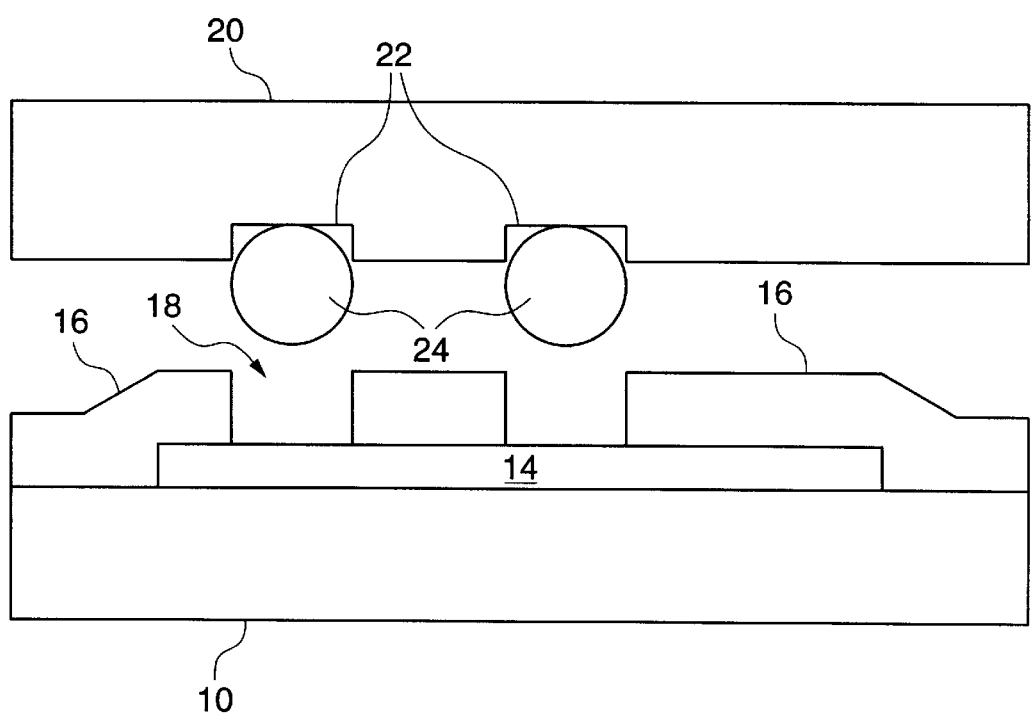

Referring to FIG. 4, a cross section of circuit board 10 is shown to further illustrate the present invention. A device package 20 has electrical access areas 22 formed on its bottom surface. Device package 20 may be, for example, an integrated circuit chip package, an optical chip package, or some other type of device package. Although electrical access areas 22 are shown as recessed areas on the bottom surface of device package 20, it will be understood that electrical access areas 22 may be flush with or elevated from the bottom surface of device package 20. Device package 20 may have a casing formed of, for example, injection-molded plastic, and may therefore be much less expensive to manufacture than, for example, gull-wing-leaded ceramic packages. Solder balls 24 are attached to electrical access areas 22 using techniques conventionally used in ball grid array integrated circuit chip package assembly.

During the circuit board assembly process, electrical access areas 22 and solder balls 24 are aligned with corresponding contact holes 18 in solder mask 16. Solder balls 24 are then placed in contact with the areas of pads 14 exposed by contact holes 18. A conventional solder reflow process such as those commonly used in ball grid array integrated circuit chip package assembly is then used to secure device package 20 to circuit board 10. For example, a conventional heated vapor gas may be used to reflow solder balls 24 to create solder joints.

Although solder balls 24 are used to illustrate the attachment of device package 20 to circuit board 10, it will be understood that a conductive adhesive or other material capable of creating mechanical and electrical contact between device package 20 and circuit board 10, such as a conductive epoxy, may be substituted for solder balls 24. In that case, a curing process may take the place of the solder reflow process described above.

In one exemplary embodiment, pads 14 each measure 0.018 inch in width and 0.1 inch in length, with a spacing of 0.007 inch between adjacent pads. In this embodiment, contact holes 18 have a diameter of 440 microns, with a center-to-center distance of 0.05 inch between contact holes 18 on the same pad 14, while solder balls 24 have a diameter of 560 microns.

The aforementioned exemplary embodiment has a larger contact area per pad 14, and therefore higher tensile and shear strengths, than a second exemplary embodiment in which three contact holes 18 are formed over each pad 14, with the contact holes 18 on each pad 14 being aligned in a linear (i.e. non-staggered) fashion with contact holes 18 on adjacent pads 14. In this second exemplary embodiment, a solder ball diameter of only 400 microns and a contact hole diameter of only 300 microns may be used. These smaller diameters are necessary to prevent physical and electrical contact between solder balls 24 on adjacent pads 14. Thus, the novel staggered contact hole arrangement illustrated in FIG. 2 represents a significant improvement in available contact and ball area over a more conventional linear array of solder joints.

It will be appreciated that the above-described method for mounting a ball grid array-type device package on a circuit board originally designed for gull-wing-leaded chips may allow a less expensive chip to be used with the circuit board without a substantial redesign of the circuit board. Furthermore, the above-described mounting method allows gull-wing-leaded packages and ball grid array-type packages to be used interchangeably for substantially the same circuit board design, with only the solder mask being different in each case.

Although the present invention and its advantages have been described in detail, it should be understood that various changes, substitutions, and alterations can be made therein without departing from the spirit and scope of the invention as defined by the appended claims.

I claim:

1. A circuit board comprising:
   a chip mount area having a plurality of elongated pads designed for contact with device package leads;
   a device package having a plurality of electrical access areas formed on a surface of the device package;
   a plurality of adhesive joints, each adhesive joint providing a connection between one of the electrical access areas of the device package and one of the pads of the chip mount areas at least one of the pads of the chip mount area being connected to a plurality of the electrical access areas of the device package by a corresponding plurality of the adhesive joints.

2. The circuit board of claim 1, wherein each one of the pads of the chip mount area is connected to a plurality of the electrical access areas of the device package by a corresponding plurality of the adhesive joints.

3. The circuit board of claim 1, further comprising a mask having a plurality of openings aligned with the plurality of electrical access areas of the device package.

4. The circuit board of claim 1, wherein the plurality of adhesive joints comprises a staggered arrangement of adhesive joints.

5. The circuit board of claim 1, wherein each of the adhesive joints comprises a solder joint.

6. A method for attaching a device package to a circuit board having a plurality of elongated pads located near the perimeter of a chip mount area of the circuit board, comprising:
   forming a mask on the circuit board;
   forming a plurality of openings in the mask, including forming a plurality of openings over at least one of the pads;
   attaching a plurality of adhesive masses to a surface of the device package, each adhesive mass being aligned with an electrical contact area on the surface of the device package;
   positioning the device package over the circuit board to align the adhesive masses of the surface of the device package with the openings in the mask; and
   attaching the device package to the circuit board using the adhesive masses.

7. The method of claim 6, wherein forming the plurality of openings in the mask comprises forming a plurality of openings over each one of the pads.

8. The method of claim 6, wherein forming the plurality of openings in the mask comprises forming two openings over each one of the pads.

9. The method of claim 7, wherein forming the plurality of openings in the mask further comprises forming openings on adjacent pads in a staggered formation.

10. The method of claim 6, wherein each adhesive mass comprises a solder mass, and wherein attaching the device package to the circuit board using the adhesive masses comprises reflowing the solder masses.

* * * * *